(12) United States Patent
Hembert

(10) Patent No.: US 10,205,464 B2
(45) Date of Patent: Feb. 12, 2019

(54) ANALOG VIDEO SIGNAL SUPPLY CIRCUIT

(71) Applicant: STMicroelectronics (Alps) SAS, Grenoble (FR)

(72) Inventor: Serge Hembert, Vaulnaveys le Haut (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 15/235,714

(22) Filed: Aug. 12, 2016

(65) Prior Publication Data

US 2017/0222656 A1    Aug. 3, 2017

(30) Foreign Application Priority Data

Jan. 29, 2016  (FR) ...................................... 16 50733

(51) Int. Cl.
*H04N 5/14* (2006.01)
*H04N 9/64* (2006.01)
*H03M 1/66* (2006.01)
*H04N 7/01* (2006.01)
*H04N 19/44* (2014.01)
(Continued)

(52) U.S. Cl.
CPC ................ *H03M 1/66* (2013.01); *H04N 5/04* (2013.01); *H04N 7/01* (2013.01); *H04N 19/44* (2014.11); *H04N 5/63* (2013.01)

(58) Field of Classification Search
CPC .. H04N 5/04; H04N 5/63; H04N 7/01; H04N 7/24; H04N 3/18; H04N 19/40
USPC ....... 348/571, 572, 573, 508, 537, 554, 441, 348/455, 456, 457, 474, 492, 639, 646, 348/651, 660, 719, 720, 293, 211.5, 348/207.99, 138; 330/1 R, 66, 106, 330/124 R, 199, 260; 341/110, 116, 117, 341/118, 120, 144; 345/100, 690, 661
See application file for complete search history.

(56) References Cited

U.S. PATENT DOCUMENTS 6,507,296 B1 * 1/2003 Lee ..................... H03M 1/1004
                                                      341/120
6,518,970 B1   2/2003 Glen et al.
(Continued)

FOREIGN PATENT DOCUMENTS

CN           203632782 U      6/2014

OTHER PUBLICATIONS

Maliniak D: "Color Palette D—A Converters Paint a Bright Video Picture," Electronic Design, Penton Media, Cleveland, OH, US, vol. 35, No. 26, Special ISS, Nov. 1, 1987, 6 pages.
(Continued)

*Primary Examiner* — Brian P Yenke
*Assistant Examiner* — Mustafizur Rahman
(74) *Attorney, Agent, or Firm* — Crowe & Dunlevy

(57) ABSTRACT

An analog video signal supply circuit includes a processing circuit that supplies first and second digital video signals. First and second digital-to-analog converters convert digital signals to analog signals. A control circuit controls operation in a first configuration where the first digital video signal is applied to an input of the first digital-to-analog converter and the second digital video signal to an input of the second digital-to-analog converter. The control circuit further controls operation in a second configuration where the first digital video signal is simultaneously applied to the inputs of the first and second digital-to-analog converters.

6 Claims, 2 Drawing Sheets

(51) Int. Cl.
*H04N 5/04* (2006.01)
*H04N 5/63* (2006.01)

(56) References Cited

U.S. PATENT DOCUMENTS

| | | | | |
|---|---|---|---|---|
| 6,538,702 B1* | 3/2003 | Taketani | | H04N 5/455 348/505 |
| 8,290,065 B2* | 10/2012 | Tsai | | H04N 5/0675 348/388.1 |
| 8,324,909 B2* | 12/2012 | Oakes | | H04N 21/4143 324/555 |
| 8,638,168 B1* | 1/2014 | Signoff | | H03F 1/0244 330/124 R |
| 9,071,169 B2* | 6/2015 | Arnet | | H02M 1/08 |
| 9,520,848 B2* | 12/2016 | Kishikawa | | G09G 3/3688 |
| 2001/0010748 A1* | 8/2001 | Murata | | H04N 9/804 386/307 |
| 2001/0052864 A1 | 12/2001 | Shimizu et al. | | |
| 2003/0034997 A1* | 2/2003 | McKain | | G11B 31/006 715/723 |
| 2004/0218269 A1* | 11/2004 | Divelbiss | | H04N 13/0029 359/464 |
| 2004/0227717 A1* | 11/2004 | Yeh | | G09G 3/3648 345/100 |
| 2004/0268415 A1* | 12/2004 | Noda | | H04N 5/4401 725/134 |
| 2006/0250289 A1* | 11/2006 | Tsuchi | | G09G 3/3688 341/144 |
| 2006/0256241 A1* | 11/2006 | Suzuki | | H04L 12/40117 348/706 |
| 2007/0052733 A1* | 3/2007 | Hirabayashi | | G09G 3/002 345/661 |
| 2007/0182443 A1* | 8/2007 | Funada | | G09G 3/2092 348/554 |
| 2008/0030584 A1* | 2/2008 | Tsai | | H04N 5/0675 348/207.99 |
| 2008/0062328 A1* | 3/2008 | Bilbrey | | H04N 5/765 348/705 |
| 2008/0084338 A1* | 4/2008 | Tsai | | H03M 1/1028 341/120 |
| 2008/0150775 A1* | 6/2008 | Nozawa | | G09G 5/005 341/139 |
| 2008/0273030 A1* | 11/2008 | Kato | | G06T 11/40 345/420 |
| 2009/0015726 A1* | 1/2009 | Jitsuhara | | H04N 5/4403 348/734 |
| 2009/0021643 A1* | 1/2009 | Hsueh | | H04N 9/642 348/572 |
| 2009/0190033 A1* | 7/2009 | Asada | | G09G 5/006 348/554 |
| 2009/0290127 A1* | 11/2009 | Kobayashi | | H04N 5/7416 353/30 |
| 2010/0026214 A1* | 2/2010 | Nagumo | | H05B 33/0842 315/313 |
| 2012/0147271 A1* | 6/2012 | Choi | | H04N 5/765 348/572 |
| 2012/0182162 A1* | 7/2012 | Currivan | | H04B 1/10 341/51 |
| 2013/0113994 A1 | 5/2013 | Chen | | |
| 2013/0214864 A1* | 8/2013 | Tsou | | H03F 3/45071 330/260 |
| 2014/0184659 A1* | 7/2014 | Kang | | G09G 3/3648 345/690 |
| 2015/0256191 A1* | 9/2015 | Yamamoto | | H03M 1/12 341/120 |
| 2016/0301927 A1* | 10/2016 | Hsu | | G01R 27/02 |
| 2016/0322008 A1* | 11/2016 | Sang | | G09G 3/3275 |
| 2017/0223299 A1* | 8/2017 | Hembert | | H04N 5/44 |
| 2018/0035069 A1* | 2/2018 | Hembert | | G09G 5/006 |

OTHER PUBLICATIONS

INPI Search Report and Written Opinion for FR 1650733 dated Apr. 5, 2016 (10 pages).

* cited by examiner

ANALOG VIDEO SIGNAL SUPPLY CIRCUIT

PRIORITY CLAIM

This application claims the priority benefit of French Application for Patent No. 1650733, filed on Jan. 29, 2016, the disclosure of which is hereby incorporated by reference in its entirety to the maximum extent allowable by law.

TECHNICAL FIELD

The present disclosure generally relates to video decoders, and more particularly aims at decoders capable of supplying analog video signals to be displayed by display devices provided with analog video inputs.

BACKGROUND

A video decoder is conventionally placed upstream of a display device such as a television set, a video projector, a computer screen, etc. The decoder receives a compressed digital video flow, for example, from the Internet (ADSL, cable, etc.), from a digital optical disk (DVD, Blu-ray, etc.), from a hard disk, from a digital radio receiver, or from any storage or digital transmission support, and converts this flow into a video signal adapted to the downstream display device. To ensure a compatibility with various display devices, a video decoder generally has a plurality of output interfaces capable of supplying the decoded video flow in different formats. In recent installations, the link between the decoder and the display device most often is a digital link, for example, an HDMI link or a DVI link. However, to ensure the compatibility with older installations and/or with certain specific applications, video decoders are almost systematically equipped, in addition to one or a plurality of digital outputs, with one or a plurality of analog video outputs, for example, an output at the CVBS format (composite video) and/or an output at the YPbPr format. Circuits for supplying the decoded video signals in analog form are here more particularly considered.

SUMMARY

An embodiment provides an analog video signal supply circuit comprising: a first circuit for supplying first and second digital video signals; first and second digital-to-analog converters; and a second control circuit configurable to, in a first configuration, simultaneously apply the first digital video signal to the input of the first converter and the second digital video signal to the input of the second converter and, in a second configuration, apply the first digital video signal simultaneously to the input of the first converter and to the input of the second converter.

According to an embodiment, the second circuit is capable, in the first configuration, of applying to the first converter a first clock signal and to the second converter a second clock signal different from the first clock signal and, in the second configuration, of applying the first clock signal to the first and second converters.

According to an embodiment, the analog video signal supply circuit further comprises third and fourth digital-to-analog converters, and: the first circuit is capable of supplying third and fourth digital video signals; and the second circuit is capable, in the first configuration, of simultaneously applying the third digital video signal to the input of the third converter and the fourth digital video signal to the input of the fourth converter and, in the second configuration, of applying the first digital video signal simultaneously to the input of the third and fourth converters.

According to an embodiment, the second circuit is capable, in the first configuration, of applying to the third and fourth converters the second clock signal and, in the second configuration, of applying the first clock signal to the third and fourth converters.

According to an embodiment, the second circuit comprises one or a plurality of multiplexers.

Another embodiment provides a video decoder comprising an analog video signal supply circuit such as defined hereabove.

According to an embodiment, the analog video signal supply circuit is programmed in the first configuration, and the output terminals of the first and second digital-to-analog converters are coupled to different analog output terminals of the decoder.

According to an embodiment, the analog video signal supply circuit is programmed in the second configuration, and the output terminals of the first and second digital-to-analog converters are coupled to a same analog output terminal of the decoder.

Another embodiment provides a system comprising a video decoder such as defined hereabove, and a video signal display device comprising an analog input, wherein the sum of the output powers of said digital-to-analog converters is substantially equal to the power required by the display device on its analog input.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
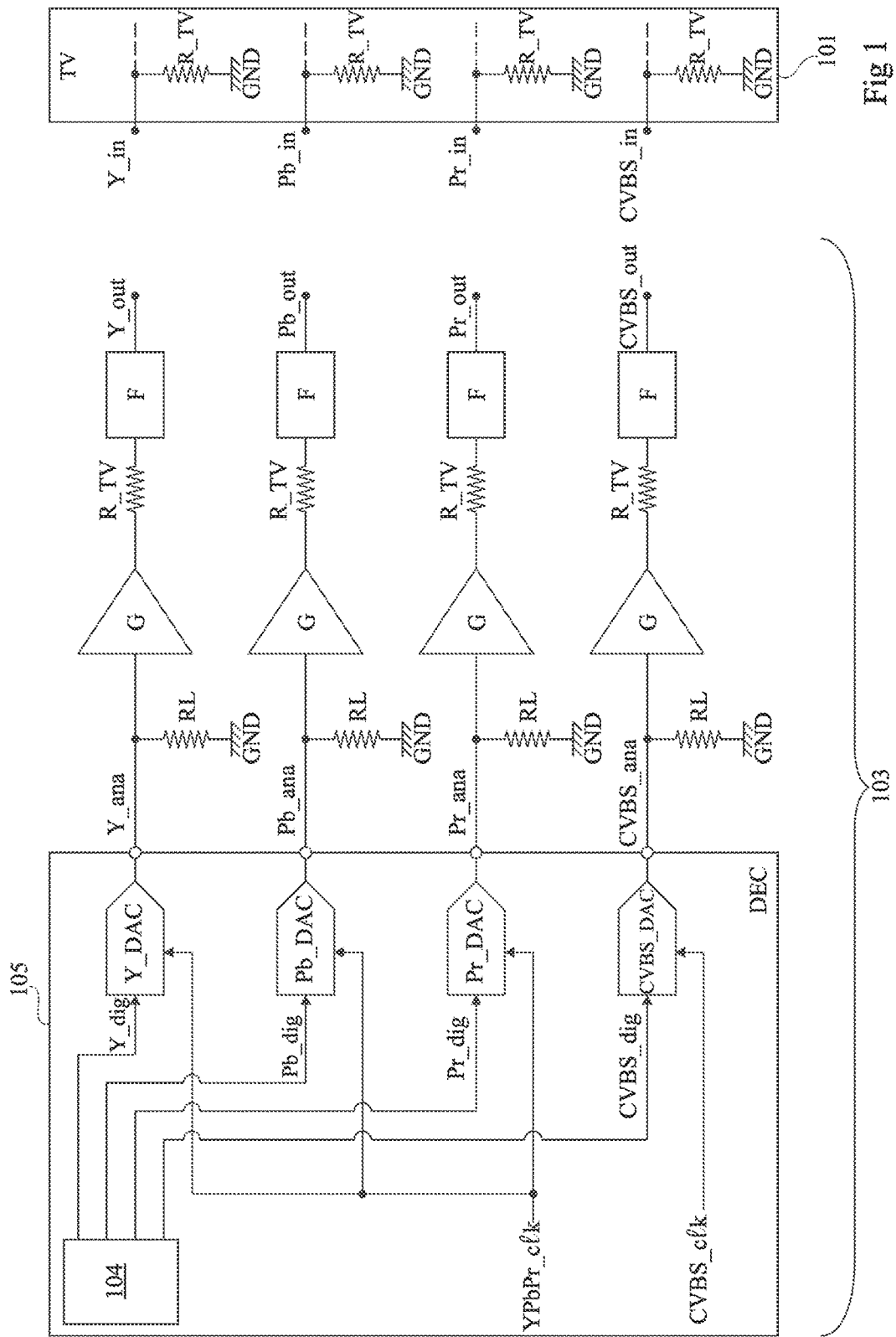
FIG. 1 is a simplified electric diagram of an example of an installation comprising a video decoder capable of supplying analog video signals.

The same elements have been designated with the same reference numerals in the different drawings. For clarity, only those elements which are useful to the understanding of the described embodiments have been shown and are detailed. In particular, in the examples of video decoders of FIGS. 1 and 2, only the analog video signal supply circuits have been shown and are detailed. The other elements that a video decoder may comprise (digital input/output interfaces, digital processing circuits, memories, audio signal management circuits, etc.) are not detailed, the described embodiments being compatible with usual components of a video decoder. In the present description, term "connected" is used to designate a direct electric connection, with no intermediate electronic component, for example, by means of one or a plurality of conductive tracks or of one of a plurality of conductive wires, and term "coupled" or term "linked" is used to designate either a direct electric connection (then meaning "connected") or a connection via one or a plurality of intermediate components (resistor, diode, capacitor, etc.). Unless otherwise specified, expressions "approximately", "substantially", and "in the order of" mean to within 10%, preferably to within 5%.

FIG. 1 is a simplified electric diagram of an example of an installation comprising a video decoder capable of supplying analog video signals. The installation of FIG. 1 comprises a display device 101, for example, a television set (TV), and a video decoder 103.

In this example, decoder 103 is capable of supplying a decoded video flow in two different analog formats, the CVBS format, also called composite video format, and the YPbPr format. In the CVBS format, the video signal transits over a single conductor conveying both the chrominance information and the luminance information of the image. In the YPbPr format, the video signal transits in parallel over three different conductors respectively transporting a signal corresponding to luminance Y of the image, a signal corresponding to difference Pb=Y−B between luminance Y and the blue component of the image, and a signal corresponding to difference Pr=Y−R between luminance Y and the red component of the image. Thus, decoder 103 comprises four analog output terminals CVBS_out, Pr_out, Pb_out, and Y_out, respectively supplying the analog video signal at the CVBS format, component Pr of the analog video signal at the YPbPr format, component Pb of the analog video signal at the YPbPr format, and component Y of the analog video signal at the YPbPr format. In the shown example, display device 101 comprises four analog input terminals CVBS_in, Pr_in, Pb_in, and Y_in, respectively capable of receiving the analog video signal at the CVBS format, component Pr of the analog video signal at the YPbPr format, component Pb of the analog video signal at the YPbPr format, and component Y of the analog video signal at the YPbPr format. To use the CVBS analog output of decoder 103, the user connects output terminal CVBS_out of decoder 103 to input terminal CVBS_in of display device 101 by means of a cable, not shown. To use analog output YPbPr of decoder 103, the user connects output terminals Y_out, Pb_out, and Pr_out of decoder 103 respectively to input terminals Y_in, Pb_in, and Pr_in of display device 101 by means of cables, not shown.

Inside of decoder 103, the video signals at the CVBS and YPbPr formats are first generated in digital form from the compressed video flow by means of processing circuits which have not been detailed. More particularly, decoder 103 includes a processing circuit 104 (not detailed) supplying in parallel, on four different digital signal transmission paths, a digital signal CVBS_dig representative of the CVBS analog video signal to be transmitted, a digital signal Y_dig representative of component Y of the YPbPr analog video signal to be transmitted, a digital signal Pb_dig representative of component Pb of the YPbPr analog video signal to be transmitted, and a digital signal Pr_dig representative of component Pr of the YPbPr analog video signal to be transmitted.

Decoder 103 further comprises four digital-to-analog converters Y_DAC, Pb_DAC, Pr_DAC, and CVBS_DAC, respectively receiving on their digital inputs signal Y_dig, signal Pb_dig, signal Pr_dig, and signal CVBS_dig. The output of converter Y_DAC is coupled to a terminal Y_ana supplying an analog signal representative of component Y of the YPbPr video signal to be transmitted. The output of converter Pb_DAC is coupled to a terminal Pb_ana supplying an analog signal representative of component Pb of the YPbPr video signal to be transmitted. The output of converter Pr_DAC is coupled to a terminal Pr_ana supplying an analog signal representative of component Pr of the YPbPr video signal to be transmitted. The output of converter CVBS_DAC is coupled to a terminal CVBS_ana supplying an analog signal representative of the CVBS video signal to be transmitted. In the shown example, digital-to-analog converters Y_DAC, Pb_DAC, Pr_DAC, and CVBS_DAC, are rated by clock signals. Due to the different natures of video signals YPbPr and CVBS, converters Y_DAC, Pb_DAC, Pr_DAC dedicated to supplying the YPbPr signal are not rated at the same frequency as converter CVBS_DAC dedicated to supplying the CVBS signal. Converters Y_DAC, Pb_DAC, Pr_DAC receive a same clock signal YPbPr_clk, and converter CVBS_DAC receives a clock signal CVBS_clk generally different from signal YPbPr_clk. Apart from the rate difference, converters Y_DAC, Pb_DAC, Pr_DAC, and CVBS_DAC may be identical or similar.

In the example of FIG. 1, output terminals Y_ana, Pb_ana, Pr_ana, and CVBS_ana of digital-to-analog converters Y_DAC, Pb_DAC, Pr_DAC, and CVBS_DAC are not directly connected to output terminals Y_out, Pb_out, Pr_out, and CVBS_out of decoder 103, but are connected thereto via various elements for matching the output signals of the digital-to-analog converters. In the shown example, each of terminals Y_ana, Pb_ana, Pr_ana, CVBS_ana is coupled to the corresponding output terminal Y_out, Pb_out, Pr_out, CVBS_out of decoder 103 via an amplifier G, an impedance matching resistor R_TV, and an analog filter F. More particularly, in the shown example, each of terminals Y_ana, Pb_ana, Pr_ana, CVBS_ana is coupled to the input of an amplifier G, and is further coupled to a reference potential node GND, for example, the ground, via a charge resistor RL. The output of amplifier G is coupled to a first end of an impedance matching resistor R_TV, the second end of resistor R_TV being coupled to the corresponding output terminal Y_out, Pb_out, Pr_out, CVBS_out via a filter F.

Amplifier G has the function of increasing the power of the analog signal supplied by the digital-to-analog converter, which is generally too low to be directly transmitted to the display device.

Impedance matching resistor R_TV is selected to be substantially equal to the impedance of the corresponding input terminal Y_in, Pb_in, Pr_in, CVBS_in of display device 101, that is, in the order of 75 ohms in most installations.

Optional filter F enables to remove possible parasitic signals, for example due to the digital-to-analog conversion.

Most often, the digital-to-analog converters of a video decoder (converters Y_DAC, Pb_DAC, Pr_DAC, CVBS_DAC in the shown example) are integrated in a same semiconductor chip 105 (DEC). Chip 105 may be a chip of large dimensions, implementing not only the functions of digital-to-analog conversion of the video signals to be transmitted, but also other functions of the video decoder, for example, the decompressing of the input digital video flow, the generation of digital signals Y_dig, Pb_dig, Pr_dig, CVBS_dig representative of the analog signals to be transmitted, the managing of the different digital and analog interfaces of the decoder, the managing of the audio signals, etc. Output matching elements G, RL, R_TV, F are generally external to chip 105.

For certain applications, simplified decoders comprising a limited number of analog outputs, for example, a single CVBS-type analog output, are formed. This enables to decrease the cost and the bulk of the decoder, for example, when it is known in advance that the display device comprises no YPbPr analog input. However, for simplification and to decrease costs linked to the design and to the forming of analog signal generation circuit 105, it is desired to be able to use the same circuit 105 in decoders having both an analog output at the CVBS format and an analog output at the YPbPr format, and decoders only having one analog output at the CVBS format.

An object of an embodiment is to provide a circuit capable of supplying analog video signals in at least two different analog formats, where the circuit may be used either to form a decoder having analog outputs in both formats, or to form a simplified decoder having an analog output in a single one of the two formats.

An object of an embodiment is to provide such a circuit enabling, when it is used for its second destination (simplified decoder), to form a particularly simple and compact decoder, particularly by enabling to decrease the number and/or the bulk and/or the power consumption of the output matching elements necessary to form the decoder.

Figure 2:
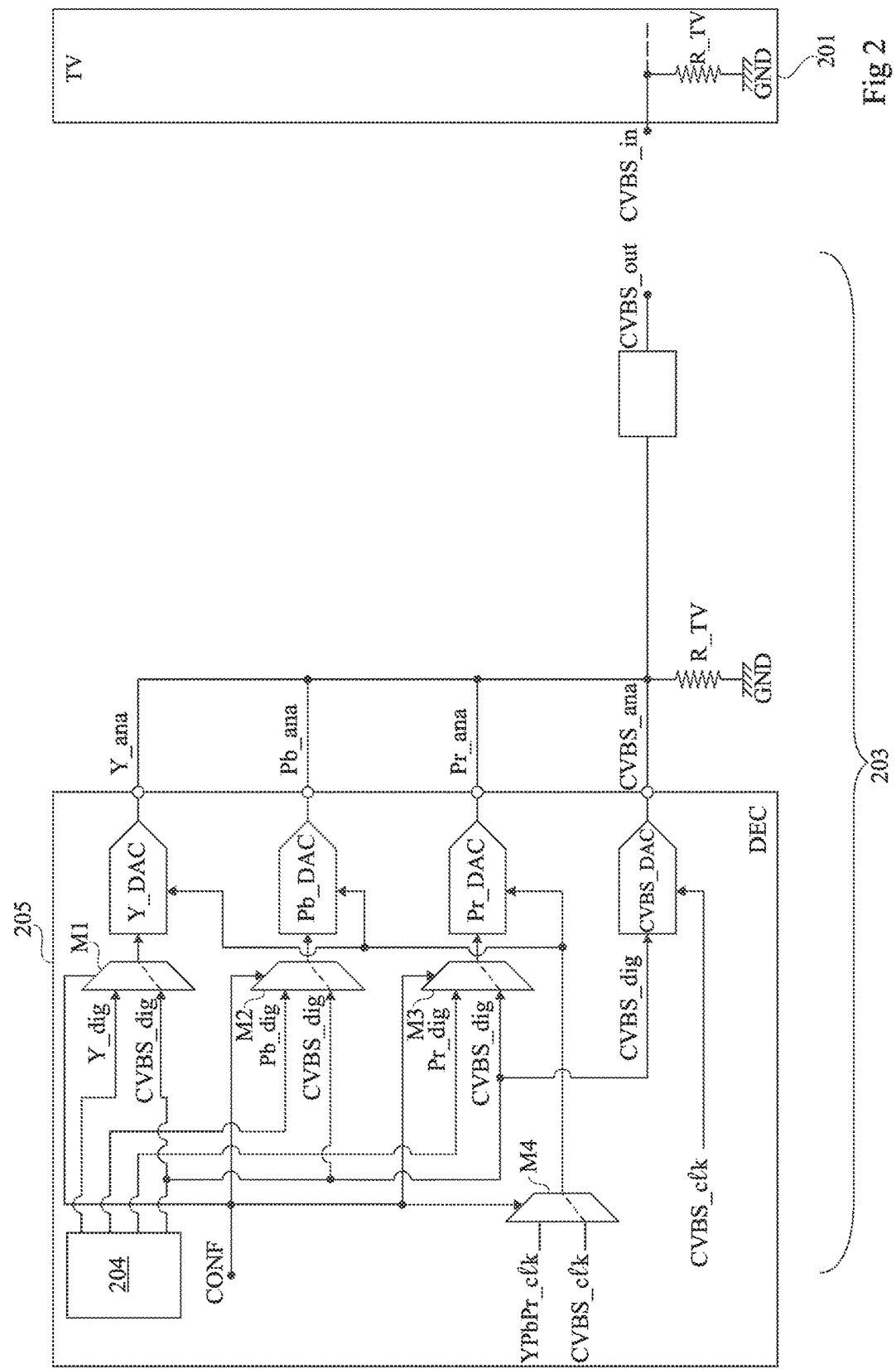
FIG. 2 is a simplified electric diagram of an example of an installation comprising an embodiment of a video decoder capable of supplying analog video signals.

FIG. 2 is a simplified electric diagram of an example of an installation comprising an embodiment of a video decoder capable of supplying analog video signals. The installation of FIG. 2 comprises a display device 201, for example, a television set (TV), and a video decoder 203.

Decoder 203 is a simplified decoder capable of supplying the decoded video signal in a single analog format, the CVBS format in the shown example. Thus, decoder 203 comprises an analog output terminal CVBS_out which supplies the analog video signal at the CVBS format, but which has no analog output at the YPbPr format. Of course, decoder 203 may further be capable of supplying the decoded video signal in one or a plurality of digital formats (HDMI, DVI, etc.), via outputs, not shown.

Inside of decoder 203, video signals at the CVBS and YPbPr formats are generated in digital form from the compressed video flow by means of processing circuits which have not been detailed. More particularly, decoder 203 includes a processing circuit 204 (not detailed) supplying in parallel, over four different digital signal transmission paths, a digital signal CVBS_dig representative of the CVBS analog video signal to be transmitted, a digital signal Y_dig representative of component Y of the YPbPr video signal, a digital signal Pb_dig representative of component Pb of the YPbPr video signal, and a digital signal Pr_dig representative of component Pr of the YPbPr video signal.

Decoder 203 further comprises, as in the example of FIG. 1, four digital-to-analog converters Y_DAC, Pb_DAC, Pr_DAC, and CVBS_DAC, for example, identical or similar. The output of converter Y_DAC is connected to a terminal Y_ana, the output of converter Pb_DAC is connected to a terminal Pb_ana, the output of converter Pr_DAC is connected to a terminal Pr_ana, and the output of converter CVBS_DAC is connected to a terminal CVBS_ana.

Decoder 203 further comprises a control circuit configurable to:
  in a first configuration, simultaneously apply digital signal Y_dig to the input of converter Y_DAC, digital signal Pb_dig to the input of converter Pb_DAC, digital signal Pr_dig to the input of converter Pr_DAC, and digital signal CVBS_dig to the input of converter CVBS_DAC; and
  in a second configuration, simultaneously apply digital signal CVBS_dig to the inputs of the four converters Y_DAC, Pb_DAC, Pr_DAC, and CVBS_DAC.

As an example, the control circuit comprises:
  a first multiplexer M1 having two inputs and one output, having its first and second inputs respectively receiving digital data signals Y_dig and CVBS_dig and having its output connected to the input of converter Y_DAC;
  a second multiplexer M2 having two inputs and one output, having its first and second inputs respectively receiving digital data signals Pb_dig and CVBS_dig and having its output connected to the input of converter Pb_DAC; and
  a third multiplexer M3 having two inputs and one output, having its first and second inputs respectively receiving digital data signals Pr_dig and CVBS_dig and having its output connected to the input of converter Pr_DAC.

In the shown example, digital-to-analog converters Y_DAC, Pb_DAC, Pr_DAC, and CVBS_DAC, are rated by clock signals, and the control circuit is further capable of:
  in the first configuration, applying a same first clock signal YPbPr_clk to converters Y_DAC, Pb_DAC and Pr_DAC and applying a second clock signal CVBS_clk different from signal YPbPr_clk to converter CVBS_DAC; and
  in the second configuration, simultaneously applying clock signal CVBS_clk to the four converters Y_DAC, Pb_DAC, Pr_DAC, and CVBS_DAC.

As an example, the control circuit further comprises a fourth multiplexer M4 having two inputs and one output, having its first and second inputs respectively receiving digital clock signals YPbPr_clk and CVBS_clk and having its output connected to a node of application of a clock signal common to converters Y_DAC, Pb_DAC, and Pr_DAC.

In this example, the data input of converter CVBS_DAC directly receives (with no interposed modulator) digital signal CVBS_dig, and the node of application of the clock signal of the converter CVBS_DAC directly receives (with no interposed multiplexer) signal CVBS_clk.

Multiplexers M1, M2, M3, and M4 are for example simultaneously controllable by means of a same configuration signal CONF, for example, a binary signal. The first configuration of the control circuit (digital signals Y_dig, Pb_dig, Pr_dig, and CVBS_dig converted into analog signals by converters Y_DAC, Pb_DAC, Pr_DAC, and CVBS_DAC, respectively) corresponds to a first state of signal CONF, and the second configuration of the control circuit (digital signal CVBS_dig simultaneously converted into analog by the four converters Y_DAC, Pb_DAC, Pr_DAC, and CVBS_DAC) corresponds to a second state of signal CONF.

In the example of FIG. 2, the control circuit is programmed in its second configuration, that is, the four digital-to-analog converters Y_DAC, Pb_DAC, Pr_DAC, and CVBS_DAC simultaneously convert the same digital video signal CVBS_dig into an analog signal. Output terminals Y_ana, Pb_ana, and Pr_ana of converters Y_DAC, Pb_DAC, and Pr_DAC are all three connected to output terminal CVBS_ana of converter CVBS_DAC. In the shown example, output terminal CVBS_ana of the digital-to-analog conversion circuit is connected to output terminal CVBS_out of decoder 203 via a filter F. Filter F enables to remove possible parasitic signals, for example, due to the digital-to-analog conversion. Filter F may however be omitted, and terminal CVBS_ana can then be directly connected to terminal CVBS_out. Terminal CVBS_ana is further connected to a reference potential GND, for example, the ground, via an impedance matching resistor R_TV. Impedance matching resistor R_TV is selected to be substantially equal to the impedance CVBS_in of display device 201, that is, in the order of 75 ohms in most installations.

As appears in FIG. 2, decoder 203 comprises no amplifier between terminal CVBS_ana of the digital-to-analog conversion circuit and output terminal CVBS_out of the decoder. Indeed, in the example of FIG. 2, analog-to-digital converters Y_DAC, Pb_DAC, Pr_DAC, and CVBS_DAC all four contribute, in parallel, to supplying an analog output signal on terminal CVBS_ana. As a result, for identical sizings of the digital-to-analog converters, the power of the analog signal provided on output terminal CVBS_ana in the example of FIG. 2 is approximately four times greater than in the example of FIG. 1. This enables to decrease, or even to totally suppress, needs for amplification of the output signal of the digital-to-analog conversion circuit.

To form a decoder comprising an analog output at the CVBS format and an analog output at the YPbPr format, the control circuit may be programmed in its first configuration, that is, so that the four digital-to-analog converters Y_DAC, Pb_DAC, Pr_DAC, and CVBS_DAC respectively convert the four digital signals Y_dig, Pb_dig, Pr_dig, and CVBS_dig into four different analog signals. In this case, output terminals Y_ana, Pb_ana, Pr_ana, and CVBS_ana are not connected, but are respectively coupled to output terminals Y_out, Pb_out, Pr_out, and CVBS_out of the decoder via matching elements, similarly or identically to what has been described in relation with FIG. 1.

Digital-to-analog converters Y_DAC, Pb_DAC, Pr_DAC, and CVBS_DAC, as well as multiplexers M1, M2, M3, and M4, may be integrated in a same semiconductor chip 205 (DEC). Configuration signal CONF may be stored in a configuration memory of decoder 203, for example, integrated to chip 205. Chip 205 may further comprise other circuits implementing other functions of the decoder, for example, the decompression of the input digital video flow, the generation of digital signals Y_dig, Pb_dig, Pr_dig, CVBS_dig representative of the analog signals at the CVBS and YPbPr formats, the management of the different digital and analog interfaces of the decoder, the management of audio signals, etc.

An advantage of analog video signal supply circuit 205 described in relation with FIG. 2 is that it may be used either to form a decoder having analog outputs in the two CVBS and YPbPr formats, or to form a simplified decoder having an analog output in the CVBS format only.

Another advantage is that when it is used for its second destination (decoder with a single analog output), this circuit enables to form a particularly simple and compact decoder, since it delivers an analog signal of relatively high power, which decreases or even suppresses the need to amplify the output signal of the digital-to-analog conversion circuit.

Specific embodiments have been described. Various alterations, modifications, and improvements will occur to those skilled in the art. In particular, the described embodiments are not limited to the single above-motioned example where the two considered video formats are the YPbPr format and the CVBS format. More generally, the described embodiments may be adapted to other analog video formats, for example, the RGB format, the YUV format, etc. Further, the number of analog video formats which may be supplied by circuit 205 in its first configuration may be greater than two, and the number of analog video formats that circuit 205 may supply in its second configuration may be greater than one. Further, the number of components of each analog video format may be different from what has been described in the above-mentioned examples.

It should be noted that in the example of FIG. 1, the output power of the digital-to-analog converters Y_DAC, Pb_DAC, Pr_DAC, CVBS_DAC may be selected independently from the power required by display device 101, the output loads (resistors RL in the example of FIG. 1) and the gain of amplifier G being capable of being adjusted to provide the required power to display device 101. In the example of FIG. 2, the output powers of digital-to-analog converters Y_DAC, Pb_DAC, Pr_DAC, CVBS_DAC are preferably selected so that the sum of the output powers of converters Y_DAC, Pb_DAC, Pr_DAC, CVBS_DAC is substantially equal to the power required by display device 201, to be able to totally do without an amplifier when circuit 205 is used in a simplified decoder having a single analog output. This constraint on the output power of converters Y_DAC, Pb_DAC, Pr_DAC, CVBS_DAC however remains compatible with the forming of a conventional decoder of the type described in relation with FIG. 1.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A video decoder, comprising:
a processing circuit configured to supply first, second, third, and fourth digital video signals, the first digital video signal being supplied as a composite video signal, the second digital video signal being supplied as a first portion of a component video signal, the third digital video signal being supplied as a second portion of the component video signal, and the fourth digital video signal being supplied as a third portion of the component video signal;
first, second, third, and fourth digital-to-analog converters; and
a control circuit operating in a first configuration to apply the first digital video signal to an input of the first digital-to-analog converter, apply the second digital video signal to an input of the second digital-to-analog converter, apply the third digital video signal to an input of the third digital-to-analog converter, and apply the fourth digital video signal to an input of the fourth digital-to-analog converter, and further operating in a second configuration to apply the first digital video signal simultaneously to the inputs of the first digital-to-analog converter, the second digital-to-analog converter, the third digital-to-analog converter, and the fourth digital-to-analog converter.

2. The video decoder of claim 1, wherein the control circuit further operates in the first configuration to apply to the first digital-to-analog converter a first clock signal and to apply to the second, third and fourth digital-to-analog converters a second clock signal different from the first clock signal and further operates in the second configuration to apply the first clock signal to all of the first, second, third and fourth digital-to-analog converters.

3. The video decoder of claim 1, wherein the control circuit comprises multiplexer circuits.

4. The video decoder of claim 1, wherein when the processing circuit is programmed, in the first configuration, to couple output terminals of the first digital-to-analog converter and output terminals of the second, third, and fourth digital-to-analog converters to different analog output terminals of the video decoder.

5. The video decoder of claim 1, wherein when the processing video signal supply circuit is programmed, in the second configuration, to couple output terminals of the first, second, third, and fourth digital-to-analog converters to a same analog output terminal of the video decoder.

6. A video decoding system, comprising:
a video signal display device comprising an analog input terminal; and
a video signal supply circuit, wherein the video signal supply circuit comprises:
a processing circuit configured to supply first second, third, and fourth digital video signals, the first digital video signal being supplied as a composite video signal, the second, third, and fourth digital video signals being supplied as portions of a component video signal;
first, second, third, and fourth digital-to-analog converters;
a control circuit operating in a first configuration to apply the first digital video signal to an input of the first digital-to-analog converter and apply the second, third, and fourth digital video signals to inputs of the second, third, and fourth digital-to-analog converters and further operating in a second configuration to apply the first digital video signal simultaneously to the inputs of both the first digital-to-analog converter and the second, third, and fourth digital-to-analog converters;
an analog output terminal wherein when the video signal supply circuit is programmed, in the second configuration, to couple output terminals of the first, second, third, and fourth digital-to-analog converters to said analog output terminal; and
a connection between the analog output terminal and the analog input terminal;
wherein a sum of output powers of said first second, third, and fourth digital-to-analog converters is sufficient to provide power required by the video signal display device having the analog input terminal.

* * * * *